United States Patent
Bernick et al.

(10) Patent No.: US 9,349,576 B2
(45) Date of Patent: May 24, 2016

(54) MAGNETRON FOR CYLINDRICAL TARGETS

(75) Inventors: Mark A. Bernick, White Oak, PA (US); Richard Newcomb, McKeesport, PA (US)

(73) Assignee: Angstrom Sciences, Inc., Duquesne, PA (US)

(*) Notice: Subject to any disclaimer, the term of this patent is extended or adjusted under 35 U.S.C. 154(b) by 2060 days.

(21) Appl. No.: 11/724,026

(22) Filed: Mar. 14, 2007

(65) Prior Publication Data

US 2008/0012460 A1 Jan. 17, 2008

Related U.S. Application Data

(60) Provisional application No. 60/783,689, filed on Mar. 17, 2006, provisional application No. 60/859,393, filed on Nov. 16, 2006.

(51) Int. Cl.
| | |
|---|---|
| C23C 14/34 | (2006.01) |
| H01J 37/34 | (2006.01) |
| C23C 14/35 | (2006.01) |

(52) U.S. Cl.
CPC ......... *H01J 37/3405* (2013.01); *C23C 14/3407* (2013.01); *C23C 14/35* (2013.01); *H01J 37/3452* (2013.01)

(58) Field of Classification Search
CPC .............. H01J 37/3405; H01J 37/3452; C23C 14/3407; C23C 14/35
USPC ........................................ 204/298.21, 298.22
See application file for complete search history.

(56) References Cited

U.S. PATENT DOCUMENTS

| | | | |
|---|---|---|---|
| 4,448,653 A | 5/1984 | Wegmann | |
| 5,571,393 A * | 11/1996 | Taylor et al. | 204/298.21 |
| 5,736,019 A | 4/1998 | Bernick | |
| 5,865,970 A | 2/1999 | Stelter | |
| 6,171,461 B1 | 1/2001 | Bernick | |
| 6,365,010 B1 * | 4/2002 | Hollars | 204/192.12 |
| 7,223,322 B2 * | 5/2007 | Bernick | 204/192.12 |
| 2003/0173217 A1 * | 9/2003 | Crowley | 204/298.22 |
| 2004/0140208 A1 * | 7/2004 | German et al. | 204/298.21 |
| 2006/0049043 A1 * | 3/2006 | Matuska et al. | 204/298.21 |

FOREIGN PATENT DOCUMENTS

WO  WO 2006/042808  * 4/2006

* cited by examiner

*Primary Examiner* — John Brayton
(74) *Attorney, Agent, or Firm* — The Webb Law Firm

(57) ABSTRACT

A magnet arrangement which is usable as both a retrofit magnetic arrangement in a rotatable cylindrical magnetron sputtering electrode as well as a drive assembly in communication with the electrode for delivering high current into a target surface without adding highly incremental cost to the overall design of the electrode. The electrode includes a cathode body defining a magnet receiving chamber, a rotatable cylindrical target surrounding the cathode body, wherein the target is rotatable about the cathode body. The cathode body further defines a magnet arrangement received within the magnet receiving chamber, wherein the magnet arrangement comprised of a plurality of magnets wherein at least one of the magnets is a profiled magnet having a contoured top portion.

12 Claims, 8 Drawing Sheets

MAGNETRON FOR CYLINDRICAL TARGETS

CROSS REFERENCE TO RELATED APPLICATIONS

This application claims the benefit of U.S. Provisional Application Nos. 60/783,689 entitled "Magnetron For Cylindrical Targets" filed on Mar. 17, 2006, and 60/859,393 entitled "Magnetron For Cylindrical Targets And Cathode Design Enhancements" filed on Nov. 16, 2006, which are hereby incorporated by reference.

BACKGROUND OF THE INVENTION

1. Field of the Invention

The present invention relates to a rotatable cylindrical magnetron sputtering apparatus and, more particularly, to a various hardware used with rotatable cylindrical magnetron electrodes which reduce the cost and complexity of delivering high power AC current into a target surface, and increase the target utilization and the deposition rate while reducing the amount of target material on the chamber walls and shielding.

2. Description of Related Art

A typical magnetron sputtering device includes a vacuum chamber having an electrode contained therein, wherein the electrode includes a cathode portion, an anode portion and a target. The term electrode is oftentimes referred to in the industry as a cathode. In operation, a vacuum is drawn in the vacuum chamber followed by the introduction of a process gas into the chamber. Electrical power supplied to the electrode produces an electronic discharge which ionizes the process gas and produces charged gaseous ions from the atoms of the process gas. The ions are accelerated and retained within a magnetic field formed over the target, and are propelled toward the surface of the target which is composed of the material sought to be deposited on a substrate. Upon striking the target, the ions dislodge target atoms from the target which are then deposited upon the substrate. By varying the composition of the target and/or the process gas, a wide variety of substances can be deposited on various substrates. The result is the formation of an ultra-pure thin film deposition of target material on the substrate.

Over the last decade, the cylindrical magnetron has emerged as the leading technology for sputtering coating on glass substrates. The rotating cylindrical target surface provides for a constant sputtering surface, thus eliminating the traditional erosion groove and large non-sputtered areas associated with planar targets. Further, the cylindrical target eliminates large areas of dielectric buildup that can lead to arcing, material flaking, debris and other process instabilities. Although the rotatable cylindrical magnetron has its advantages over planar magnetrons, the shape of the magnetic field which determines everything from field uniformity and deposition rate to target utilization may still be optimized further to improve the performance of the sputtering application. The use of stationary profiled magnets can be used to control the shape of the magnetic field which optimizes the performance of the sputtering application. U.S. Pat. Nos. 5,736,019 and 6,171,461, which are incorporated herein by reference, disclose and attempt to overcome under utilization of target material via the use of stationary profile magnets. The above-identified patents are directed to magnetron sputtering electrodes that include a plurality of profile magnets, each magnet including a top portion with an apex, wherein each apex is positioned adjacent a target supporting surface in the cathode body. The magnet cooperates to generate magnetic flux lines which form enclosed-looped magnetic tunnels adjacent to the front sputtering surfaces of the target. As described in the above-identified patents, these profile magnets result in optimum utilization of target materials at a reasonable rate of utilization. A problem with the conventional planar magnet arrangement is that the magnets have flat upper surfaces and, therefore, the target which the material is to be sputtered from is not completely utilized.

The development of mid-frequency AC power supplies has enabled continuous long-term sputtering of targets which are utilized in a reactive gas to form dielectric or poorly conductive thin films. Albeit a dramatic improvement above planar targets used in planar cathodes, rotatable cylindrical targets still have a region just beyond the magnetron ends (i.e., turnarounds) which are not sputtered, but rather collect a portion of the sputtered thin film. When the sputtered material builds up in these turnarounds or unetched regions to a substantial thickness thus forming an insulating layer, this layer can become a source of arcing. Although enabling power supply technology has increased process stability of the deposition process, it has simultaneously introduced increased complexity and cost into the design and arrangement of the hardware associated with the cathode drive assembly which delivers this power to the target surface. The two most common problems associated with the delivery of high power, mid-frequency (20 kHz-120 kHz) current to the cathode are (1) the ability of the brush assemblies to carry sufficient current without overheating and eroding due to the "skin-effect" of these frequencies and (2) the inherent eddy current effects induced by these frequencies which can cause extreme localized heating of various components, particularly the support bearing. To circumvent the high current requirements, many manufacturers are using custom brush assemblies with high silver content in order to overcome the above-mentioned problems. The design and manufacture of custom brushes used in these assemblies are not only costly, but the material is very brittle which can lead to a short operating life. For example, one such solution for addressing the eddy current problem is to use a custom designed ceramic bearing, which is costly and difficult to replace quickly.

Therefore, it is an object of the present invention to improve the performance of the cylindrical magnetron sputtering application by using profiled magnet arrangements to increase the target utilization and the deposition rate while reducing the amount of target material on the chamber walls and shielding of a cylindrical magnetron electrode. It is a further object of the present invention to provide an improved drive assembly for a cylindrical magnetron electrode that is designed to reduce the cost and complexity of delivering high power AC current into a rotating shaft by using common and readily available components.

SUMMARY OF THE INVENTION

The present invention provides for a magnet arrangement which is usable as a retrofit magnetic arrangement in a rotatable cylindrical magnetron sputtering electrode. The electrode includes a cathode body defining a magnet receiving chamber, a rotatable cylindrical target surrounding the cathode body, wherein the target is rotatable about the cathode body. The cathode body further defines a magnet arrangement received within the magnet receiving chamber, wherein the magnet arrangement includes a plurality of magnets and, wherein at least one of the magnets is a profiled magnet having a contoured top portion.

The present invention also provides for rotatable cylindrical magnetron sputtering device that includes the electrode of the present invention and a drive assembly in communication with the cathode body and the cylindrical target, wherein the drive assembly comprises a drive shaft and a motor and, wherein the drive shaft is rotatably connected to the cylindrical target. The drive assembly is adapted to rotate the cylindrical target and to introduce high current AC power into the target surface via the rotating drive shaft without adding highly incremental costs to the overall design of the electrode.

DETAILED DESCRIPTION OF THE INVENTION

Figure 1:
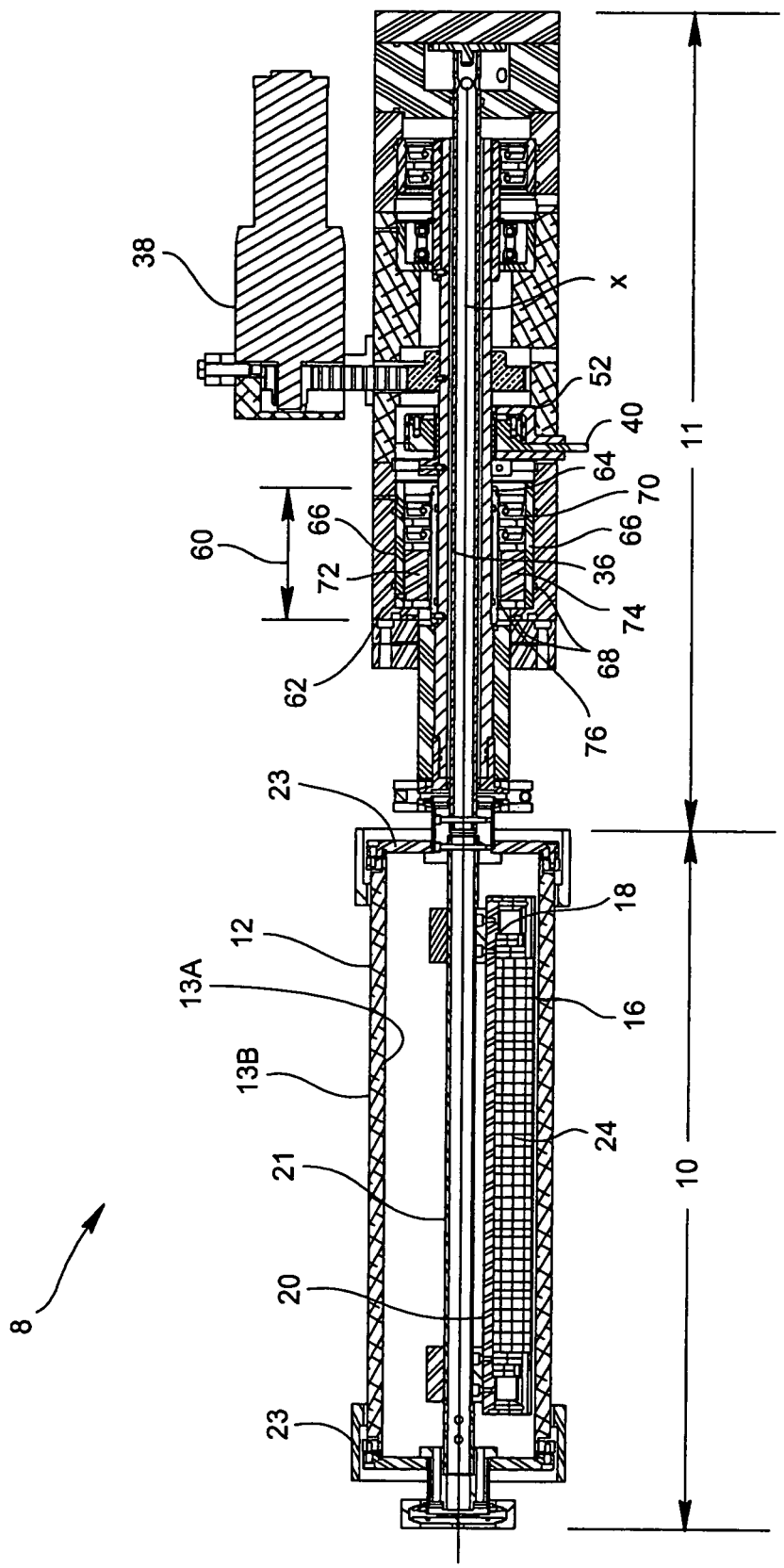
FIG. 1 is a cross sectional view of a rotatable cylindrical magnetron sputtering device made in accordance with the present invention.
Figure 1A:
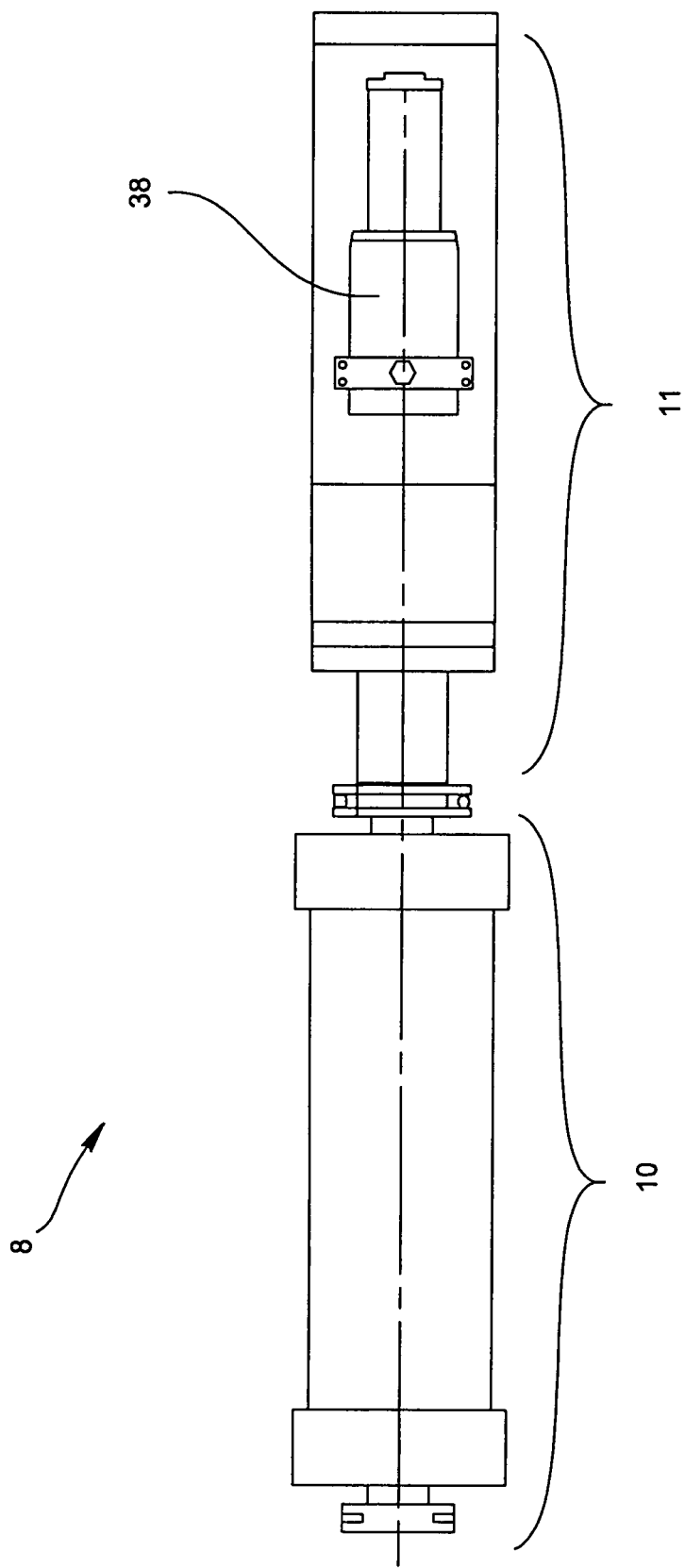
FIG. 1A is a top plan view of the magnetron sputtering device shown in FIG. 1.
Figure 2:
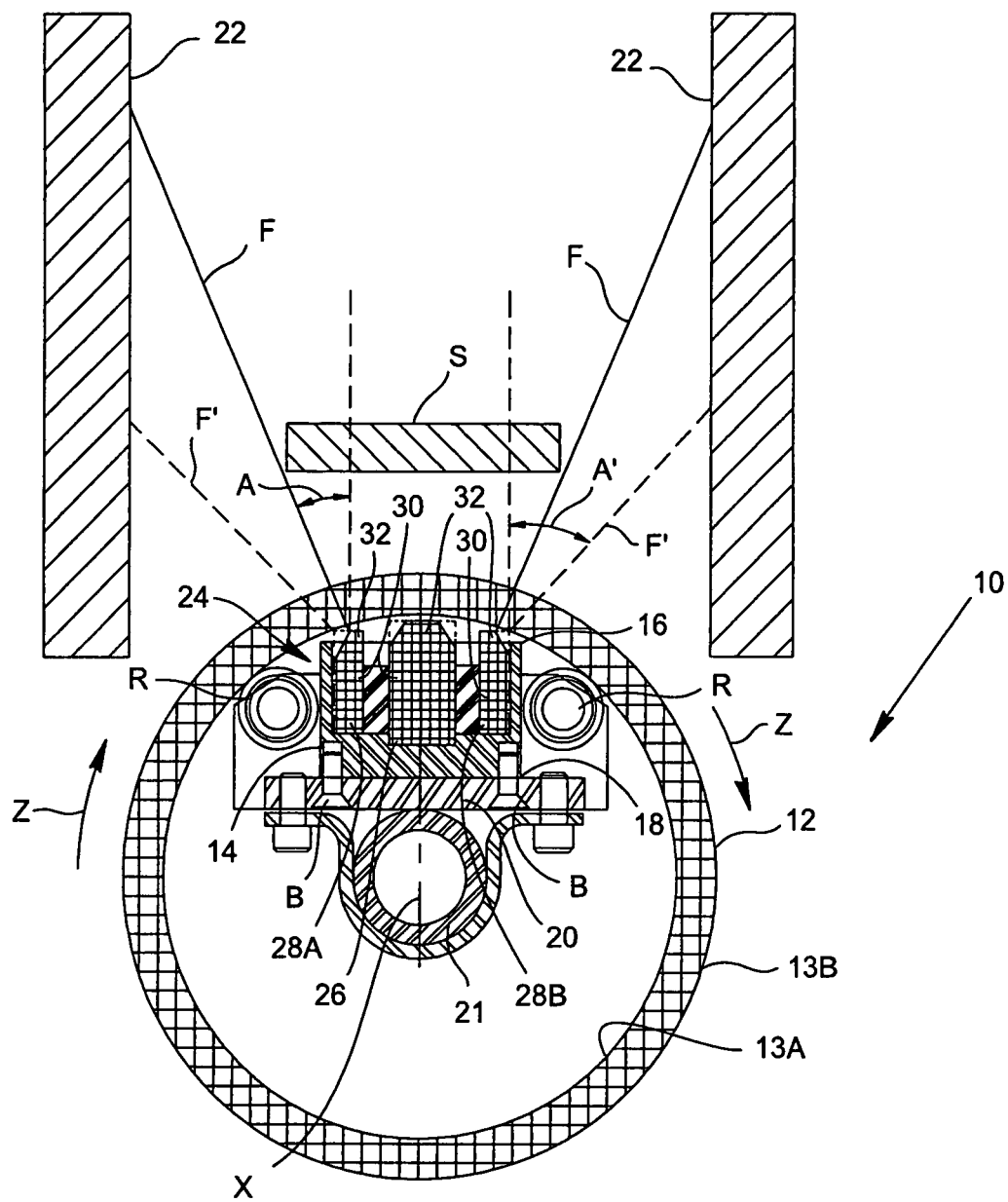
FIG. 2 is a sectional front view of an electrode of the magnetron sputtering device shown in FIG. 1, wherein magnetic flux lines are shown in relation to a substrate.
Figure 3:
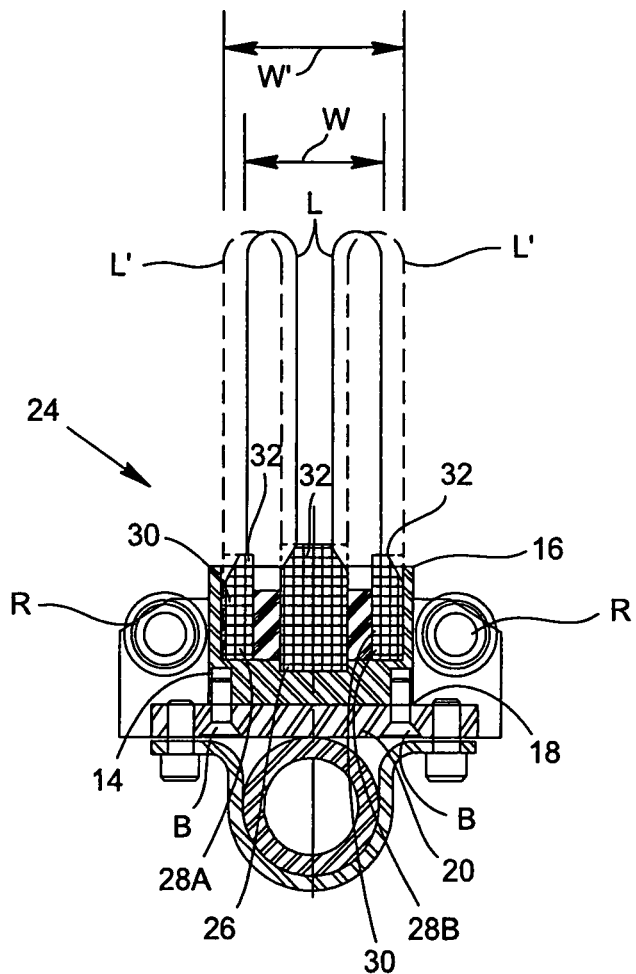
FIG. 3 is a sectional view of a cathode body of the electrode shown in FIG. 2.

The present invention provides for a rotatable cylindrical magnetron sputtering device 8 that includes an electrode 10 and a drive assembly 11 attached to the electrode 10 as shown in FIGS. 1 and 1A. Referring to FIGS. 1 and 2, the electrode 10 includes a hollow cylindrical target 12 having an inner surface 13A and an outer surface 13B, a cathode body 14 having a first surface 16 and a second surface 18 received within the cylindrical target 12, a base plate 20 attached to the second surface 18 of the cathode body 14 and a central member 21 such as a shaft or sleeve received within the cylindrical target 12 and attached to the base plate 20 for supporting the cathode body 14, wherein the cylindrical target 12 is rotatable about the cathode body 14 as shown as arrow Z in FIG. 2 about the longitudinal axis X. Referring back to FIG. 1, the cylindrical target 12 is held in place by an annular target retaining member 23, which is in communication with the drive assembly 11. Attachment of the cathode body 14 to the base plate 20 may be accomplished via one or more fasteners such as screws or bolts B or any other suitable fastening arrangement known in the art. Attachment of the base plate 20 to the central member 21 may be accomplished using a clamp or any other suitable clamping arrangement known in the art. Referring to FIGS. 2 and 3, the electrode 10 further includes a guide member such as a pair of rollers R or other guide assemblies positioned adjacent the cathode body 14 and contacting the inner surface 13A of the cylindrical target 12, thereby allowing the target 12 to rotate about the cathode body 14 at a fixed distance. The cylindrical target 12 may be, for example, standard titanium hollow tubing having a 5" inside diameter and a 6" outside diameter, which is held at a fixed distance, such as 0.60", away from the first surface 16 of the cathode body 14 to account for uniformity adjustments. Referring to FIG. 2, a substrate S is positioned directly above the cathode body 14, wherein target material is sought to be deposited onto the substrate S. Chamber walls 22 surrounding the electrode 10 and the substrate S provide a shielding for the sputtering application.

Figure 4:
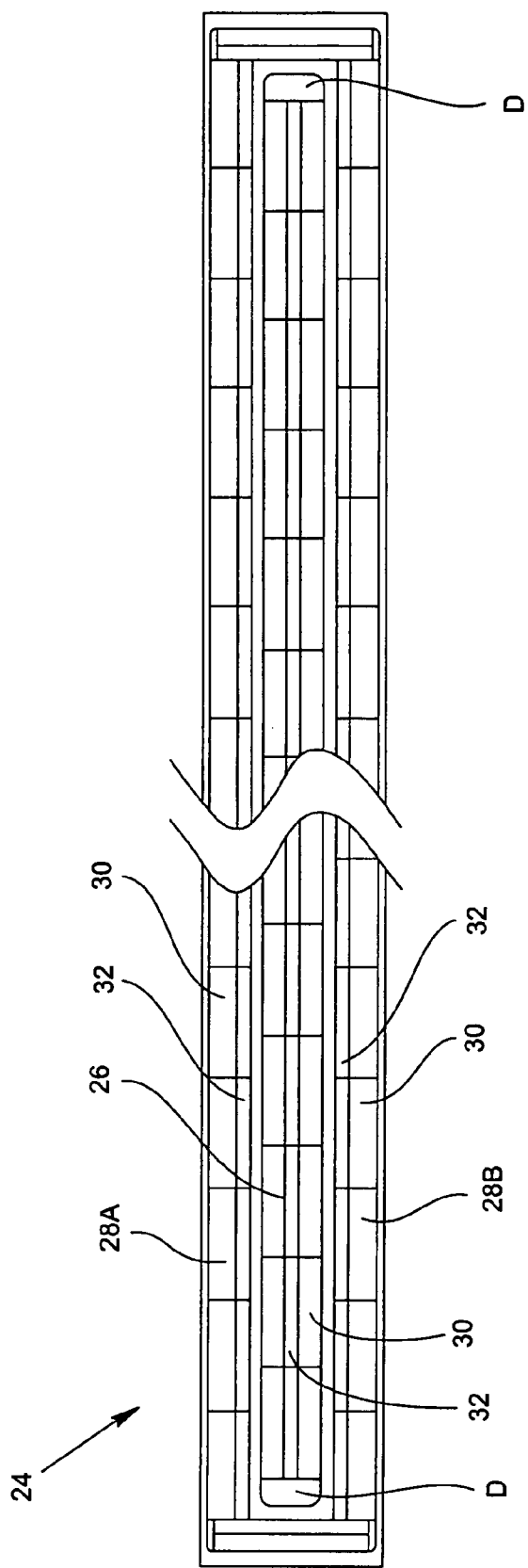
FIG. 4 is a top plan view, partially in section, of a profiled magnet arrangement of the electrode shown in FIG. 2.

Referring to FIGS. 2-4, the cathode body 14 forms a magnet receiving chamber which contains a profiled magnet arrangement 24. The profiled magnet arrangement 24 uses profiled magnets as shown and described in U.S. Pat. Nos. 5,736,019 and 6,171,461 which are hereby incorporated by reference in their entirety. The magnet arrangement 24 includes a profiled central magnet 26 and profiled end magnets 28A, 28B. Each of the profiled magnets 26, 28A and 28B has a base 30 and a contoured top portion 32. The shape of the contoured top portion 32 is shown angled, but may include sloped, conical, parabolic, convex, and concave shapes. If the contoured top portion 32 is angled, it is preferable for an apex of the contoured top portion 32 to be flat, desirably between 0.01 inch to 0.060 inch or up to half the thickness of the magnets 26, 28A and 28B. Having a flat apex minimizes the possibility of chipping the magnets 26, 28A and 28B during routine use of the completed assembly. Alternatively, the apex may come to a point. The use of such contoured shapes is conducive to directing magnetic flux lines from the contoured top portion 32 of each of the magnets 26, 28A and 28B.

With continued reference to FIGS. 2 and 3, the top portion 32 of the profiled end magnets 28A, 28B is preferably angled on one side away from the central magnet 26 wherein the apex of the top portion 32 is adjacent to the central magnet 26. The top portion 32 of the central magnet 26 is preferably angled on both sides, wherein the apex of the top portion 32 is at the center of the central magnet 26. The magnet arrangement 24 is also shown using a planar magnet having flat surfaces as shown in phantom in FIGS. 2 and 3. The primary magnetic field lines L generated from the profiled magnets 26, 28A and 28B are more centered than the magnetic field lines L' (shown in phantom) generated from planar magnets, such that an overall width W of field lines L is less than an overall width W' of the field lines L' as shown in FIG. 2. The field lines L using the profiled magnets 26, 28A and 28B reduce the off angle sputtering that is inherent to the sputtering process, thus resulting in more of the target sputtering material on the substrate S and less on the chamber walls 22. For example, a computer simulation demonstrated that the magnetic flux lines F generated using the profiled magnet arrangement 24 resulted in an angle reduction of about 15 degrees compared to the magnetic flux lines F' (shown in phantom in FIG. 2) generated using the planar magnet arrangement (i.e., an angle A approximately 15 degrees and angle A' approximately 30 degrees), thus reducing the amount of sputtered material on the chamber walls 22 from about 16.7% to 9.2%. When the sputtered material builds up on the chamber walls 22, it can fall off onto the target 12 or the substrate S thus causing the device to short out or create debris which would reduce the yield or quality of substrate S.

Further, the use of the profile magnets 26, 28A and 28B in electrode 10 provides for a greater increase in magnetic field intensity using the same size magnets in contrast to conventional planar magnets. This increase in the magnetic field intensity and the reduction of flux material on the chamber walls 22 results in an overall rate increase and target utilization in the electrode 10 of the present invention.

Initial processing uniformity may be established by adjusting the dynamic field stroke along the length of the electrode 10 to compensate for known facts such as the tendency for the magnetron ends (i.e. turnaround) to sputter at faster rates than at the center of the target 12. Therefore, it is contemplated that the ends of the central magnet 26 of the profiled magnet arrangement 24 have a diverter magnet D of a different profile such as is shown in FIG. 4. This magnet having a different profile can slow down the sputtering effect at the ends, thus reducing erosion of the target 12 at these ends.

Referring to FIG. 1, the drive assembly 11 of the magnetron sputtering device 8 includes a drive unit 34, wherein the drive unit 34 includes a drive shaft 36 and a motor 38. The drive shaft 36 is rotatably coupled to the retaining member 23. The motor 38 is coupled to the drive shaft 36, so that activation of the motor 38 causes the drive shaft 36 to rotate about an axis "X", which in turn causes the retaining member 23 having the attached cylindrical target 12 to rotate about the cathode body 14. The drive assembly 11 further includes a brush assembly 40 surrounding the drive shaft 36, wherein the brush assembly 40 coacts with the rotating drive shaft 36 to supply AC and DC electrical current to the cathode body 14, and a cathode vacuum seals and support chamber assembly 60 for introducing high current AC power from atmosphere into the rotating vacuum drive shaft 36 with negligible eddy current heating effects. The remaining components of the drive assembly 11 will not be described because these components are known in the art and are common for typical rotating cylindrical magnetron sputtering devices.

Referring to FIG. 1, the drive shaft 36 is electrically connected to the central member 21, which is affixed to the base plate 20 of the cathode body 14. Rotation of the drive shaft 36 causes the brush assembly 40 to generate high electrical current to the drive shaft 36, which transfers the current through the central member 21 and to the base plate 20 and then to the cathode body 14. The central member 21 may be, for example, a shaft made of a conductive material in order to carry electrical current to the cathode body 14.

Figure 5:
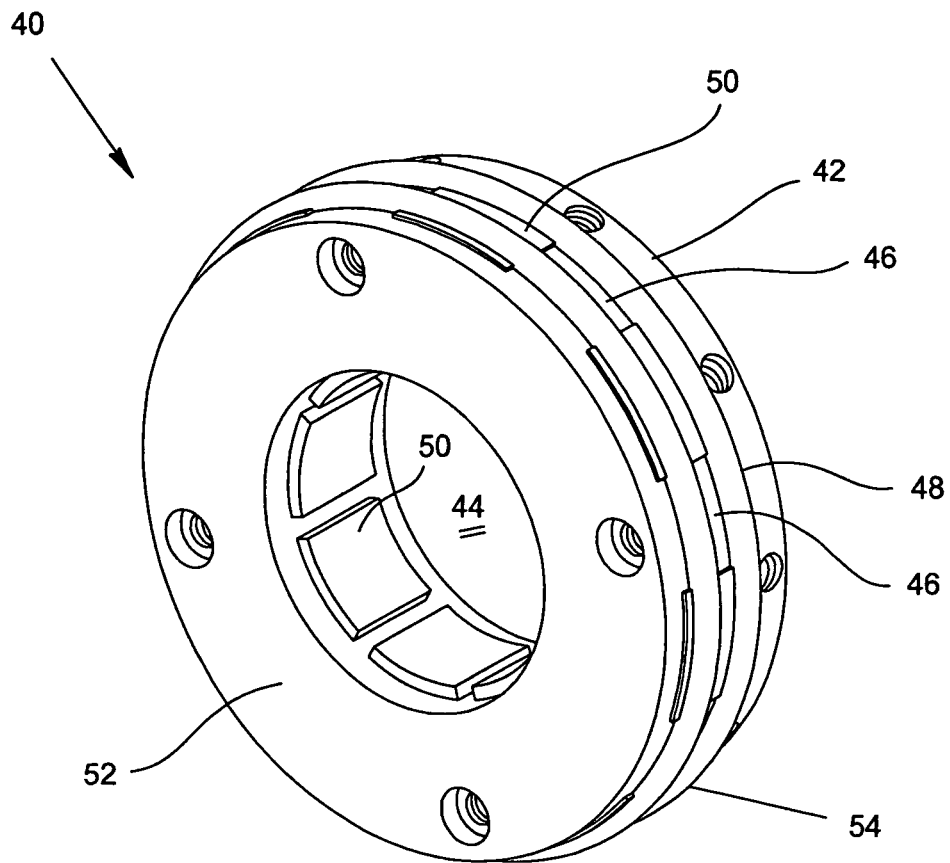
FIG. 5 is a perspective view of a high current brush assembly of the rotatable cylindrical magnetron sputtering device shown in FIG. 1.
Figure 6:
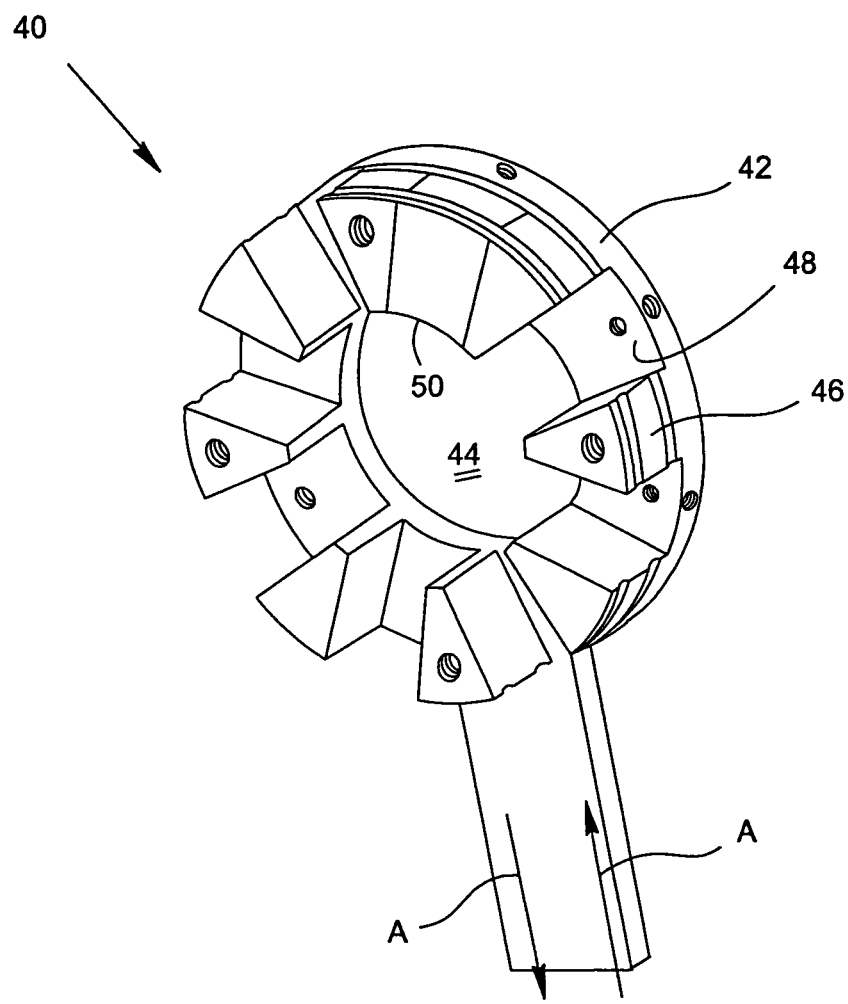
FIG. 6 is a perspective view of a housing of the high current brush assembly shown in FIG. 5.

FIGS. 5 and 6 show the high current brush assembly 40 that includes a disc-shaped housing 42 defining a central opening 44 therein, a plurality of circumferentially spaced spacers 46 arranged on a front surface 48 of the housing 42, a plurality of brushes 50 positioned between each spacer 46 and a cap 52 attached to the front surface 48 of the housing 42. The housing 42 is preferably made of copper. The brushes 50 may be standard motor brushes made of, for example, a metal graphite material such as a low grade graphite or a graphite having a slightly higher conductivity. These brushes are readily available by most major suppliers of motors. In operation, specifically when operating at high currents in the AC power mode, cooling of the brushes 50 is required to increase further the current capacity of the brushes 50. FIG. 6 shows the housing 42 without the cap 52 being supplied with cooling water as represented by arrows A, which circulates within the housing 42 thereby cooling the brushes 50. Compression of the brushes 50 onto the rotating shaft 36 extending through the opening 44 is achieved by the use of a garter spring 54 shown in FIG. 5. By using small individual segments of brushes 50 and a copper housing 42, the surface area of the entire brush assembly 40 is increased as well as the ability to cool the brushes 50, thereby achieving a higher current capacity.

Figure 7:
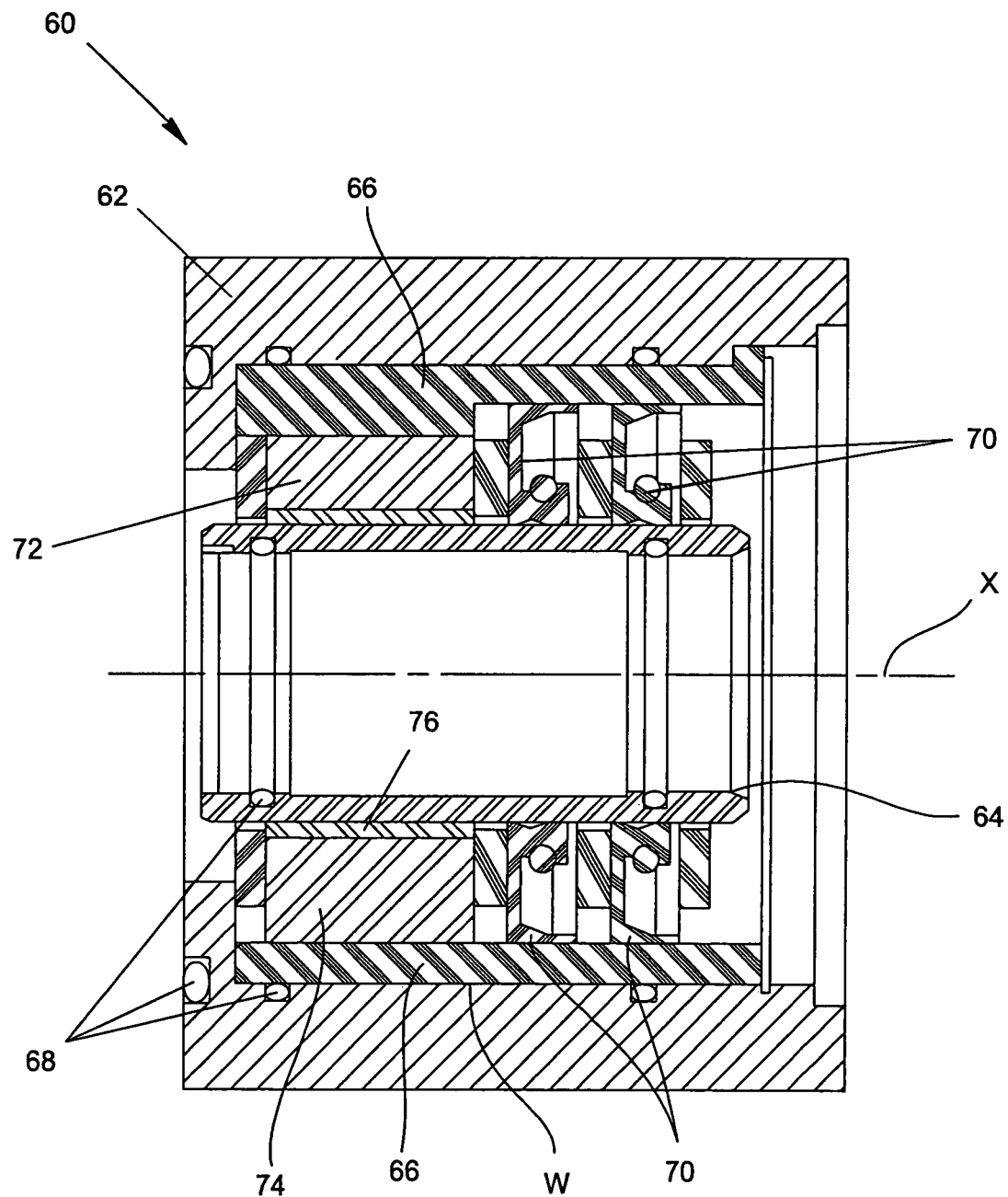
FIG. 7 is a sectional view of a cathode vacuum seal chamber of the rotatable cylindrical magnetron sputtering device shown in FIG. 1.

FIG. 7 shows a sectional view of the cathode vacuum seals and support chamber assembly 60 that includes a housing 62 and a wear sleeve 64 centrally positioned within the housing 62. An insulating member 66 is positioned between a wall W of the housing 62 and the sleeve 64 for electrically insulating the housing 62 from high voltage and electrical current. Atmosphere to vacuum seals are achieved through static O-rings 68 positioned between the housing wall W and the insulating member 66 as well as spaced rotary vacuum seals 70 positioned between the sleeve 64 and the insulating member 66. Spacer blocks 72 and 74 keep the rotary seals 70 spaced apart and aligned. The drive shaft 36 carrying the current (shown in FIG. 1) extends through the sleeve 64 and rotates about axis "X", wherein the sleeve 64 functions as front support bushing as well as a vacuum seal surface. A graphite or plastic bearing 76 is located between the sleeve 64 and the vacuum seals 70. Preferably, the bearing 76 may be manufactured from highly durable plastics such as polyimides or from highly durable graphite. The size of the bearing 76 may vary depending on the cathode size and the spacers 72, 74 as well as the sleeve 64. It is important to preferably use materials for the components that cannot only support a load induced by the cathode, but also prevent eddy currents from setting up, thereby causing extreme heating. For example, conductive materials such as highly durable plastics may be used for the bearing 76 and the other components within the vacuum assembly 60 because the high voltage is kept off of the vacuum housing 62 by the insulating member 66, thereby making these components non-susceptible to eddy current heating.

The present invention also provides for a method of improving target utilization and deposition rate in cylindrical magnetron sputtering application that includes providing a substrate S and a rotatable cylindrical magnetron device 8 of the present invention. The cylindrical target 12 is rotated around a magnet arrangement 24 and target material for the cylindrical target 12 is obtained and deposited on the substrate S.

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the intended claims and any and all equivalents thereof.

The invention claimed is:

1. A magnetron sputtering electrode for use in a rotatable cylindrical magnetron sputtering device, the electrode comprising:
   a cathode body defining a magnet receiving chamber;
   a cylindrical target surrounding the cathode body, wherein the target is rotatable about the cathode body; and
   a magnet arrangement received within the magnet receiving chamber, the magnet arrangement comprised of a plurality of magnets wherein at least one of the magnets is a profiled magnet having a contoured top portion;
   wherein the plurality of magnets comprises spaced apart profiled end magnets and a profiled central magnet defined therebetween;
   wherein the contoured top portion of the profiled central magnet has a central magnet flat apex perpendicular to a line extending radially outward from the longitudinal axis X and has central magnet angled portions on both sides relative to the central magnet flat apex such that the central magnet flat apex is at a center of the profiled central magnet; and
   wherein the contoured top portion of each of the profiled end magnets has an end magnet flat apex generally parallel to the central magnet flat apex and has an end magnet angled portion on one side relative to the end magnet flat apex such that the end magnet flat apex of the contoured top portion of each of the end magnets is adjacent to the profiled central magnet.

2. The magnetron sputtering electrode as claimed in claim 1, wherein the plurality of magnets cooperates to generate magnetic flux lines which form a closed loop magnetic tunnel adjacent to an outer surface of the cylindrical target.

3. The magnetron sputtering electrode as claimed in claim 1, wherein the cathode body has a first surface and a second surface, the electrode further comprising:
- a base plate attached to the second surface of the cathode body;
- a central member attached to the base plate, wherein the central member is adapted to support the cathode body within the cylindrical target; and
- a guide member positioned adjacent the cathode body and contacting an inner surface of the cylindrical target, wherein the guide member is adapted to allow the cylindrical target to rotate about the cathode body at a fixed distance.

4. The magnetron sputtering electrode as claimed in claim 3, wherein the guide member comprises a pair of rollers.

5. The magnetron sputtering electrode as claimed in claim 3, wherein the central member comprises a shaft made of a conductive material, the central member adapted to carry electrical power to the cathode body via the base plate.

6. The magnetron sputtering electrode as claimed in claim 1, wherein the cylindrical target comprises hollow tubing made of metal.

7. A rotatable cylindrical magnetron sputtering device comprising:
- a cathode body defining a magnet receiving chamber;
- a cylindrical target surrounding the cathode body, wherein the target is rotatable about the cathode body;
- a drive assembly in communication with the cathode body and the cylindrical target, wherein the drive assembly comprises a drive shaft and a motor, wherein the drive shaft is rotatably connected to the cylindrical target, the drive assembly adapted to rotate the cylindrical target and to introduce high current AC power into the drive shaft when the drive shaft is rotating; and
- a magnet arrangement received within the magnet receiving chamber, the magnet arrangement comprised of a plurality of magnets wherein at least one of the magnets is a profiled magnet having a contoured top portion;
- wherein the drive assembly further comprises:
- a housing;
- a wear sleeve defining a passageway therein is centrally positioned within the housing, the passageway adapted to receive the drive shaft;
- an insulating member positioned between a wall of the housing and the sleeve for electrically insulating the housing from high voltage and electrical current;
- a first group of vacuum seals positioned between the housing wall and the insulating member and a second group of vacuum seals positioned between the sleeve and the insulating member; and
- a bearing located between the sleeve and the second group of vacuum seals; and
- a brush assembly surrounding the drive shaft, wherein the brush assembly coacts with the drive shaft to supply AC and DC electrical current to the cathode body via the central member; wherein the brush assembly comprises:
- a stationary disc-shaped housing defining an opening therein for receiving the drive shaft,
- a plurality of spaced apart spacers circumferentially arranged on a surface of the housing;
- a plurality of brush segments positioned between each spacer and compressed onto the drive shaft; and
- a cooling water supply in fluid communication within the housing for cooling the brush segments.

8. The rotatable cylindrical magnetron sputtering device as claimed in claim 7, further comprising a central member in electrical communication with the drive shaft and attached to the cathode body, the central member adapted to carry the high current AC power from the drive shaft to the cathode body.

9. The rotatable cylindrical magnetron sputtering device as claimed in claim 7, wherein the cylindrical target is rotatably attached to the drive shaft via a retaining member, wherein the drive shaft is adapted to rotate the target about the magnet arrangement.

10. The rotatable cylindrical magnetron sputtering device as claimed in claim 7, wherein the brush segments comprise graphite or metal graphite.

11. The rotatable cylindrical magnetron sputtering device as claimed in claim 7, wherein the bearing comprises graphite or plastic.

12. A method of improving target utilization and deposition rate in cylindrical magnetron sputtering applications, the method comprising:
- providing a substrate;
- providing a cathode body defining a magnet receiving chamber;
- providing a cylindrical target surrounding the cathode body;
- providing a magnet arrangement received within the magnet receiving chamber, the magnet arrangement comprised of a plurality of magnets wherein at least one of the magnets is a profiled magnet having a contoured top portion, the plurality of magnets comprising spaced apart profiled end magnets and a profiled central magnet defined therebetween, the contoured top portion of the profiled central magnet has a central magnet flat apex perpendicular to a line extending radially outward from the longitudinal axis X and has central angled magnet portions on both sides relative to the central magnet flat apex such that the central magnet flat apex is at the center of the profiled central magnet, the contoured top portion of each of the profiled end magnets has an end magnet flat apex generally parallel to the flat apex of the central magnet and has an end magnet angled portion on one side relative to the end magnet flat apex, such that the end magnet flat apex of the contoured top portion of each of the end magnets is adjacent to the profiled central magnet;
- rotating the target around the magnet arrangement;
- obtaining target material from the target; and
- depositing the target material on the substrate.

* * * * *